(12) United States Patent
Chen

(10) Patent No.: US 7,388,754 B2
(45) Date of Patent: Jun. 17, 2008

(54) ELECTRONIC APPARATUS WITH A ROTATABLE HANGER FOR FIXING

(75) Inventor: Yi Jen Chen, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 343 days.

(21) Appl. No.: 11/159,318

(22) Filed: Jun. 23, 2005

(65) Prior Publication Data

US 2005/0284033 A1 Dec. 29, 2005

(30) Foreign Application Priority Data

Jun. 23, 2004 (TW) ................ 93118166 A

(51) Int. Cl.
*H05K 5/00* (2006.01)
(52) U.S. Cl. .............. 361/724; 361/726; 312/223.1
(58) Field of Classification Search ........ 361/679–683, 361/724–727; 248/200, 205.1, 207, 213.1, 248/214, 218.1, 299.1
See application file for complete search history.

(56) References Cited

U.S. PATENT DOCUMENTS 6,269,959 B1 * 8/2001 Haworth .............. 211/26

2004/0035995 A1 * 2/2004 Chen et al. .............. 248/282.1
2004/0228098 A1 * 11/2004 Robbins et al. ............ 361/725
2005/0156493 A1 * 7/2005 Yang et al. .............. 312/334.5

FOREIGN PATENT DOCUMENTS

TW 584249 6/2003

* cited by examiner

*Primary Examiner*—Jayprakash Gandhi
*Assistant Examiner*—Anthony Q Edwards
(74) *Attorney, Agent, or Firm*—Birch, Stewart, Kolasch & Birch, LLP

(57) ABSTRACT

An electronic apparatus with a rotatable hanger fixed on a rack, which has a first fixed portion. The electronic apparatus includes a housing and a rotatable element. In this case, the housing has a first pivoted portion. The rotatable element has a second pivoted portion and a second fixed portion. The second pivoted portion is pivoted with the first pivoted portion. When the rotatable element rotates to a first position, the second fixed portion contacts with the first fixed portion.

13 Claims, 4 Drawing Sheets

ELECTRONIC APPARATUS WITH A ROTATABLE HANGER FOR FIXING

BACKGROUND OF THE INVENTION

1. Field of Invention

The invention relates to an electronic apparatus and, in particular, to an electronic apparatus with a rotatable hanger fixed on a rack.

2. Related Art

With the rapid changes in the business environment, the information market has undergone many innovative changes. The most obvious trend is that the IT operational environment is going to be extremely simplified for the convenience of the enterprises to get a hold of their information within the shortest possible time and with the greatest amount of efficiency.

In particular, the servers or exchangers used in the enterprises usually have the most powerful functions and are often very expensive. To extend their lifetimes, to avoid poor heat dissipation, and for the convenience of the user, the servers or exchangers are mostly installed on a rack. The stack arrangement can further save a lot of space and energy for the enterprises.

As shown in FIG. 1, a conventional server 10 is fixed on a rack 20. The rack 20 mainly contains four vertical legs 21 and several positioning holes 22. As shown in the drawing, the server 10 has a housing 11, a plurality of fixed plates 12, a plurality of first screws 13, and a plurality of second screws 14. The housing 11 has a plurality of first through holes 15. The fixed plates 12 are formed with corresponding second through holes 16. The first screws 13 go through the second through holes 16 and the first through holes 15 for fixing the fixed plates 12 on the housing 11. The second screws 14 go through the third through holes 17 on the fixed plates 12 for fixing the fixed plates 12 onto the positioning holes 22 on the rack 20.

However, a lot of screws are used in the above-mentioned server for fixing the server on the rack. And according to this reason, the method of manufacturing the above-mentioned server spends more time for assembly and it also reduces the productivity and increases the production costs. In this case, the screws and the fixed plates 12 are bought along with the purchase of the server 10. Since they are small, they are easily lost, which may result in difficulties in assembly.

It is therefore an important subjective of the invention to provide an electronic apparatus with a rotatable hanger that reduces the use of screws and thus makes assembly much easier.

SUMMARY OF THE INVENTION

In view of the foregoing, the invention provides an electronic apparatus with a rotatable hanger that can be fixed on a rack using only a few screws.

To achieve the above object, an electronic apparatus with the rotatable hanger of the invention is fixed on a rack, which has a first fixed portion. The electronic apparatus includes a housing and a rotatable element. The housing has a first pivoted portion, and the rotatable element has a second pivoted portion and a second fixed portion. The second pivoted portion is pivoted with the first pivoted portion. When the rotatable element rotates to a first position, the second fixed portion is in contact with the first fixed portion.

As mentioned above, the electronic apparatus of the invention has a rotatable element. The rotatable element has a second pivoted portion that is pivoted with the first pivoted portion on the housing. In comparison of the invention and the prior art, the electronic apparatus with a rotatable hanger of the invention uses the rotatable element and a few screws to mount the electronic apparatus on the rack. Moreover, the rotatable element is pivoted with the housing of the electronic apparatus. Therefore, it is less likely to be lost, causing trouble for the assembly personnel. Moreover, as the number of required screws is fewer, the time required for assembly or disassembly for maintenance is reduced. This is particularly convenient for the users.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The disclosed electronic apparatus with a rotatable hanger can be a server or an exchanger and can be installed on a rack. In this embodiment, the server is taken as an example to illustrate the invention.

Figure 1:
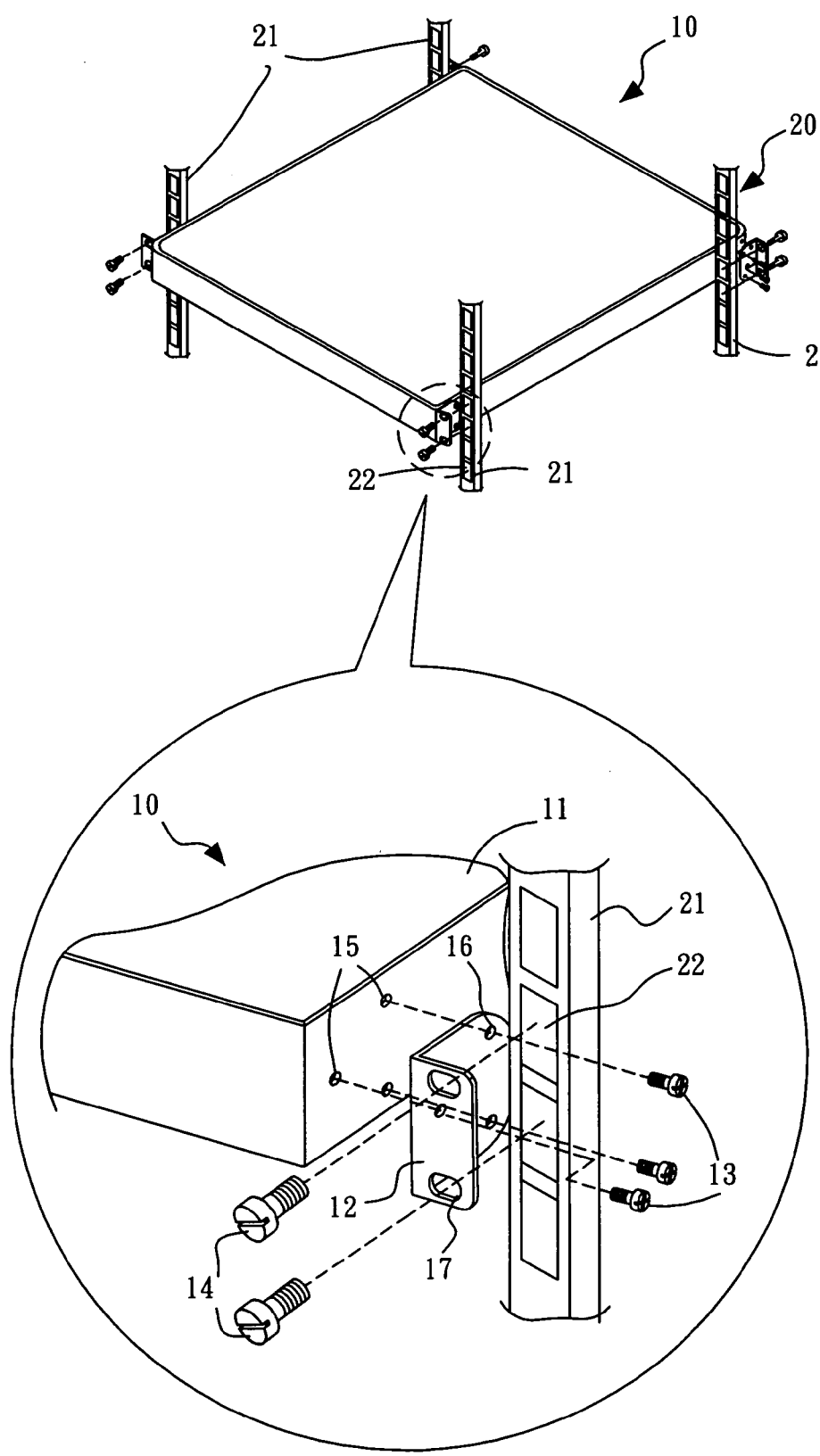
FIG. 1 is a schematic view and a local enlarged view of a conventional server fixed on a rack.
Figure 2:
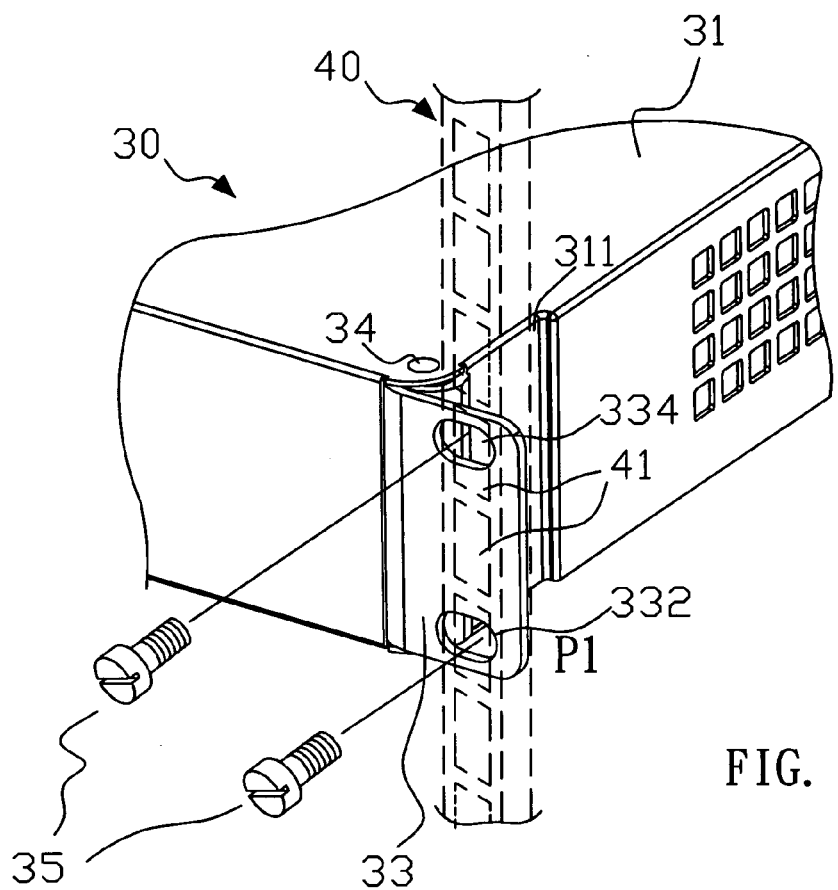
FIG. 2 is a schematic view of an electronic apparatus with a rotatable hanger according to a preferred embodiment of the invention, wherein the rotatable element is in a first position.

As shown in FIG. 2, an electronic apparatus 30 is located on a rack 40, which has a first fixed portion 41. The electronic apparatus 30 includes a housing 31 and a rotatable element 33.

Figure 3:
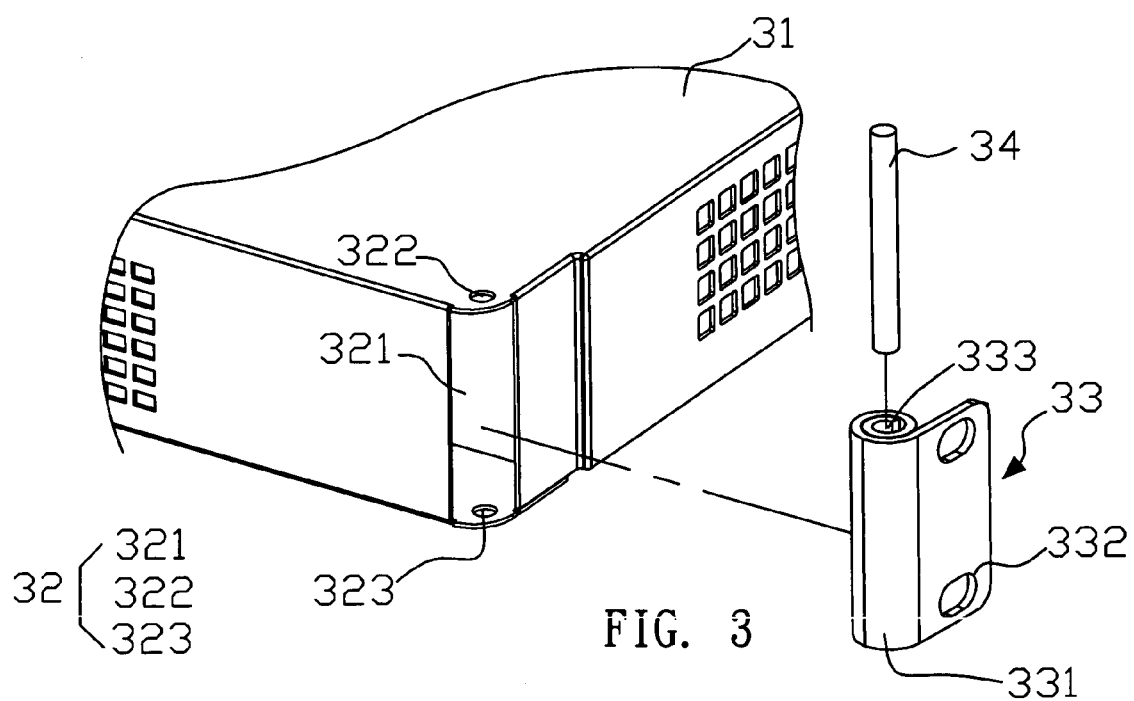
FIG. 3 is another schematic view of the electronic apparatus with a rotatable hanger according to a preferred embodiment of the invention.

With reference to FIG. 3, the housing 31 has a first pivoted portion 32, which further has an opening 321, a first hole 322, and a second hole 323 opposite to the first hole 322.

The rotatable element 33 has a second pivoted portion 331 and a second fixed portion 332. In this embodiment, the second pivoted portion 331 and the second portion 332 are integrally formed, for example, with a punching process. Moreover, the second pivoted portion 331 has a hollow through hole 333.

With reference to FIGS. 2 and 3, the electronic apparatus 30 of the embodiment further has a central axis 34. The second pivoted portion 331 is installed in the opening 321. The central axis 34 goes through the first hole 322, the second pivoted portion 331, and the second hole 323 for connecting the second pivoted portion 331 to the opening 321 pivotally. Therefore, the first pivoted portion 32 is pivoted with the second pivoted portion 331.

Referring to FIG. 2 again, when the rotatable element 33 rotates to a first position P1, the second fixed portion 332 is in contact with the first fixed portion 41. In this embodiment, the electronic apparatus 30 further includes a first screw 35 going through the second fixed portion 332 and connecting to the first fixed portion 41. The second fixed portion 332 has at least a third hole 334. The first screw 35 goes through the first fixed portion 41 and the third hole 334, to fix the electronic apparatus 30 on the rack 40.

Figure 4:
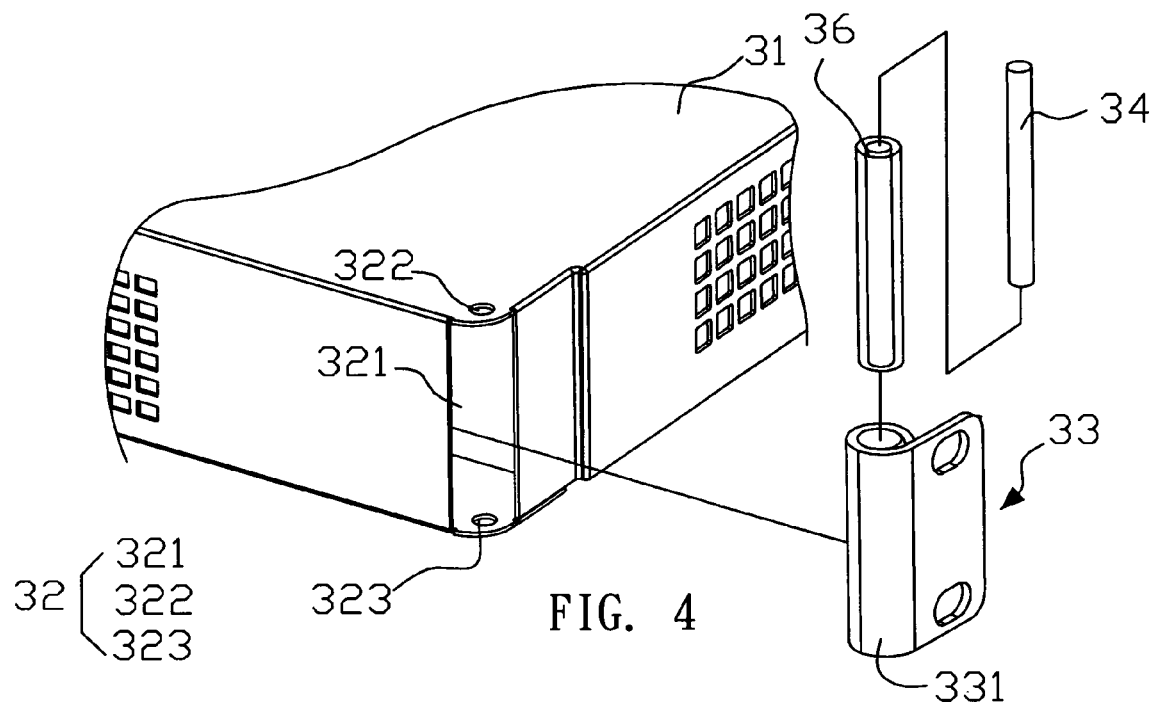
FIG. 4 is another schematic view of the electronic apparatus with a rotatable hanger according to a preferred embodiment of the invention, wherein the electronic apparatus further includes a cylindrical element.

With reference to FIG. 4, the electronic apparatus 30 can further include a cylindrical element 36 mounted inside the second pivoted portion 331. The cylindrical element 36 is hollow, for the central axis 34 to go through. Herein, the rotatable element 33 is pivoted with the first pivoted portion 32 via the central axis 34.

Figure 5:
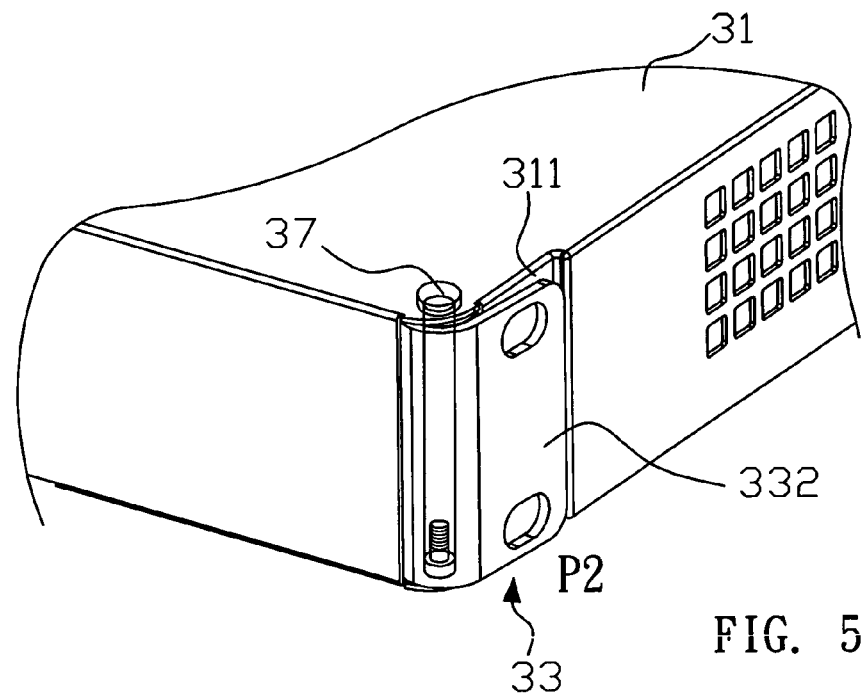
FIG. 5 is another schematic view of the electronic apparatus with a rotatable hanger according to a preferred embodiment of the invention, wherein the rotatable element is in a first position.

As shown in FIG. 5, when the rotatable element 33 rotates to a second position P2, the rotatable element 33 contacts to the housing 31. In the present embodiment, the housing 31 has a first concave portion 311. When the rotatable element 33 rotates to the second position P2, the second fixed portion 332 is attached to the first concave portion 311. Accordingly, the contact place of the rotatable element 33 and the housing 31 does not protrude and effect the actions of other elements. The integrity of the electronic apparatus 30 is thus better.

Figure 6:
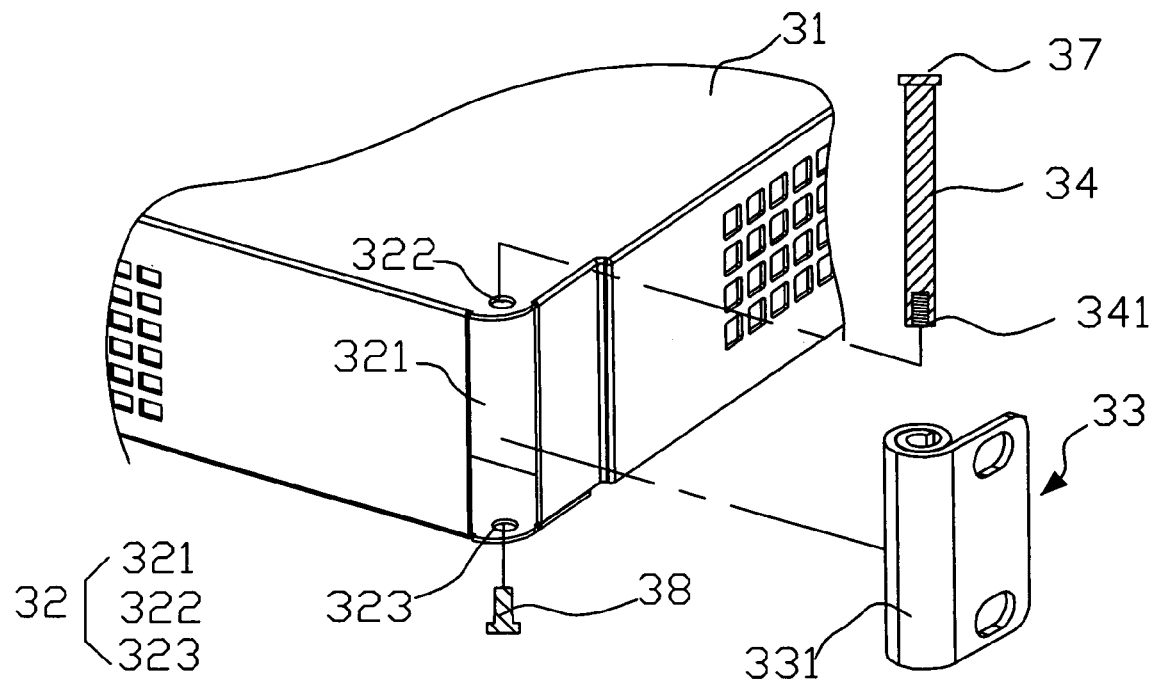
FIG. 6 is a schematic view of the central axis, the stopper, the screw holes, and the second screw in the electronic apparatus with a rotatable hanger according to a preferred embodiment of the invention.
Figure 7:
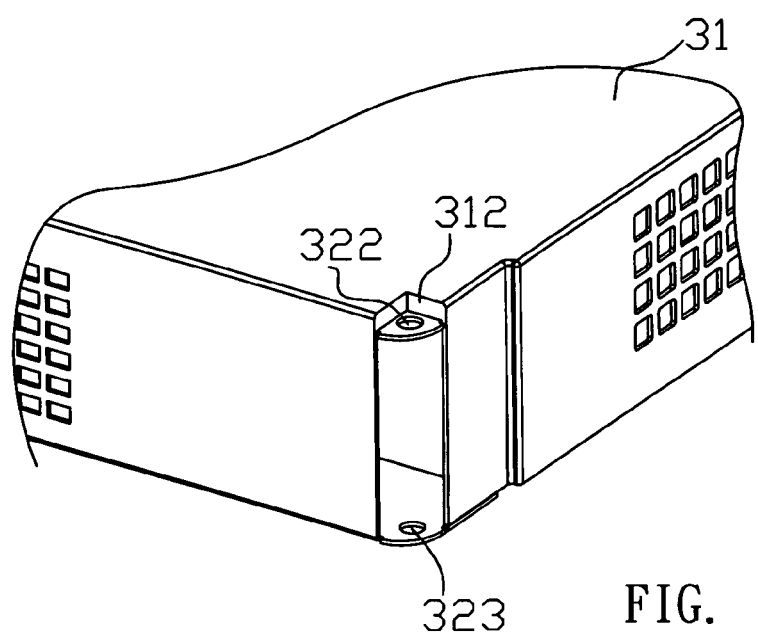
FIG. 7 is a schematic view of the electronic apparatus with a rotatable hanger according to a preferred embodiment of the invention, wherein the housing has a second concave portion.

With reference to FIGS. 5 and 6, the electronic apparatus 30 further includes at least a stopper 37 located on one end of the central axis 34 for fixing the central axis 34 and the rotatable element 33 on the first pivoted portion 32. The stopper 37 can be a rivet. Moreover, the electronic apparatus 30 of the embodiment further includes a second screw 38. At least one end of the central axis 34 has a screw hole 341. The second screw 38 goes through the second hole 323 and combines with the screw hole 341 for fixing the central axis 34 and the rotatable element 33 on the first pivoted portion 32. Of course, there can be screw holes 341 on both ends of the central axis 34.

As shown in FIG. 6, to prevent the stopper 37 from protruding from the housing 31, a second concave portion 312 is formed on the housing 31. The first hole 322 or the second hole 323 are in the second concave portion 312. In this embodiment, the first hole 322 is in the second concave portion 312.

In summary, the disclosed electronic apparatus with a rotatable hanger has a rotatable element. The rotatable element has a second pivoted portion that is pivoted with the first pivoted portion on the housing. In comparison with the prior art, the disclosed electronic apparatus with a rotatable hanger uses the rotatable element and a few screws to mount the electronic apparatus on the rack. Moreover, the rotatable element is pivoted with the housing of the electronic apparatus. Therefore, it is less likely to be lost, causing troubles for the assembly personnel. Moreover, as the numbers of required screws are fewer, the time required for assembly or disassembly for maintenance is reduced. This is particularly convenient for the users.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electronic apparatus with a rotatable hanger, wherein the electronic apparatus is fixed on a rack and the rack has at least one first fixed portion, the electronic apparatus comprising:
   a housing having a first pivoted portion; and
   a rotatable element having a second pivoted portion and a second fixed portion, wherein the second pivoted portion is pivoted with the first pivoted portion, and when the rotatable element rotates to a first position, the second fixed portion is in contact with the first fixed portion; and
   a central axis;
   wherein the first pivoted portion has an opening, a first hole, and a second hole opposite to the first hole, the second pivoted portion is disposed in the opening, and the central axis goes through the first hole, the second pivoted portion, and the second hole, and is pivoted with the second pivoted portion.

2. The electronic apparatus of claim 1, wherein the electronic apparatus is selected from one of a server and an exchanger.

3. The electronic apparatus of claim 1, wherein the second pivoted portion and the second fixed portion are integrally formed.

4. The electronic apparatus of claim 1, wherein the second pivoted portion has a hollow through hole.

5. The electronic apparatus of claim 1, further comprising:
   a stopper disposed on one end of the central axis.

6. The electronic apparatus of claim 5, wherein the stopper is a rivet.

7. The electronic apparatus of claim 1, further comprising at least one screw, wherein at least one end of the central axis is formed with a screw hole, and the screw goes through one of the first hole and the hole and combines with the screw hole.

8. The electronic apparatus of claim 1, further comprising:
   a cylindrical element mounted inside the second pivoted portion, wherein the cylindrical element is hollow.

9. The electronic apparatus of claim 1, further comprising:
   a first screw going through the second fixed portion and combined with the first fixed portion.

10. The electronic apparatus of claim 1, wherein the second fixed portion has at least one hole.

11. The electronic apparatus of claim 1, wherein when the rotatable element rotates to a second position, the rotatable element contacts the housing.

12. The electronic apparatus of claim 11, wherein the housing further has a first concave portion, and when the rotatable element rotates to the second position, the rotatable element is attached to the first concave portion.

13. The electronic apparatus of claim 1, wherein the housing further has at least one concave portion, and one of the first hole and the second hole is disposed in the one concave portion.

* * * * *